(12) United States Patent
Ito

(10) Patent No.: US 10,772,216 B2
(45) Date of Patent: Sep. 8, 2020

(54) ELECTRONIC COMPONENT, ELECTRONIC DEVICE, AND METHOD FOR MOUNTING ELECTRONIC COMPONENT

(71) Applicant: Murata Manufacturing Co., Ltd., Nagaokakyo-shi, Kyoto-fu (JP)

(72) Inventor: Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/197,403

(22) Filed: Nov. 21, 2018

(65) Prior Publication Data

US 2019/0090359 A1  Mar. 21, 2019

Related U.S. Application Data

(63) Continuation of application No. PCT/JP2018/002823, filed on Jan. 30, 2018.

(30) Foreign Application Priority Data

Feb. 23, 2017 (JP) .................................. 2017-032504

(51) Int. Cl.
*H05K 1/02* (2006.01)
*H05K 1/18* (2006.01)
(Continued)

(52) U.S. Cl.
CPC ......... *H05K 3/4617* (2013.01); *H01L 23/544* (2013.01); *H05K 1/0269* (2013.01);
(Continued)

(58) Field of Classification Search
CPC .......... H05K 3/4617; H05K 1/02; H05K 3/46; H05K 3/00; H05K 1/0269; H05K 1/0266;
(Continued)

(56) References Cited

U.S. PATENT DOCUMENTS 5,943,586 A * 8/1999 Koizumi ................. H01L 33/20
257/797
6,237,218 B1 * 5/2001 Ogawa ................. H05K 3/4638
174/254
(Continued)

FOREIGN PATENT DOCUMENTS

JP  2-224184 A   9/1990
JP  11-284292 A  10/1999
(Continued)

OTHER PUBLICATIONS

Official Communication issued in International Patent Application No. PCT/JP2018/002823, dated May 1, 2018.

*Primary Examiner* — Ishwarbhai B Patel
(74) *Attorney, Agent, or Firm* — Keating & Bennett, LLP

(57) ABSTRACT

An electronic component includes a multilayer body including insulating base materials laminated on each other and including first and second main surfaces perpendicular or substantially perpendicular to a lamination direction, and an alignment mark is defined by a conductor on one of the insulating base materials. The multilayer body includes a first layer area at a side of the first main surface and a second layer area at a side of the second main surface with respect to the alignment mark. An insulating base material in the first layer area has higher translucency than an insulating base material in the second layer area. The alignment mark is a trapezoidal cross-sectional shape including a first base at the side of the first main surface and a second base at the side of second main surface, the first base being longer than the second base.

18 Claims, 7 Drawing Sheets

(51) Int. Cl.
  *H05K 3/30* (2006.01)
  *H05K 3/46* (2006.01)
  *H01L 23/544* (2006.01)
  *H05K 1/14* (2006.01)
  *H05K 1/11* (2006.01)

(52) U.S. Cl.
  CPC ............... *H05K 1/18* (2013.01); *H05K 3/30* (2013.01); *H01L 2223/54426* (2013.01); *H05K 1/0266* (2013.01); *H05K 1/0274* (2013.01); *H05K 1/11* (2013.01); *H05K 1/141* (2013.01); *H05K 3/4626* (2013.01); *H05K 2201/09918* (2013.01); *H05K 2203/166* (2013.01)

(58) Field of Classification Search
  CPC .. H05K 1/0268; H05K 1/0284; H05K 1/0296; H05K 1/0298; H05K 1/09; H05K 1/11; H05K 1/111; H05K 1/119; H05K 1/14; H05K 1/141; H05K 1/144; H05K 1/18; H05K 1/181; H05K 3/30; H05K 3/303; H05K 3/341; H05K 3/36; H05K 3/361; H05K 3/368; H05K 2201/04; H05K 2201/09918; H05K 2201/09936; H05K 2201/2027; H05K 2203/166; H05K 2203/167; H01L 23/544; H01L 2223/54426
  See application file for complete search history.

(56) References Cited

U.S. PATENT DOCUMENTS

| | | | |
|---|---|---|---|
| 2007/0227765 A1* | 10/2007 | Sakamoto | H01L 23/49827 174/260 |
| 2008/0211086 A1 | 9/2008 | Morita | |
| 2008/0223612 A1 | 9/2008 | Muramatsu et al. | |
| 2009/0120680 A1* | 5/2009 | Tanno | H01L 21/4853 174/263 |
| 2009/0146325 A1* | 6/2009 | Liu | H01L 23/544 257/797 |
| 2009/0244865 A1* | 10/2009 | Tanaka | H01L 23/5389 361/764 |
| 2015/0271923 A1* | 9/2015 | Shimabe | H05K 1/185 174/251 |

FOREIGN PATENT DOCUMENTS

| | | |
|---|---|---|
| JP | 2003-304041 A | 10/2003 |
| JP | 2007-019280 A | 1/2007 |
| JP | 2008-159819 A | 7/2008 |
| JP | 2008-227309 A | 9/2008 |
| JP | 2012-080004 A | 4/2012 |
| JP | 2014-017035 A | 1/2014 |

* cited by examiner

ELECTRONIC COMPONENT, ELECTRONIC DEVICE, AND METHOD FOR MOUNTING ELECTRONIC COMPONENT

CROSS REFERENCE TO RELATED APPLICATIONS

This application claims the benefit of priority to Japanese Patent Application No. 2017-032504 filed on Feb. 23, 2017 and is a Continuation Application of PCT Application No. PCT/JP2018/002823 filed on Jan. 30, 2018. The entire contents of each application are hereby incorporated herein by reference.

BACKGROUND OF THE INVENTION

1. Field of the Invention

The present invention relates to an electronic component including a multilayer body of insulating base materials, an electronic device in which the electronic component is mounted, and a method for mounting the electronic component.

2. Description of the Related Art

In the related art, an alignment mark for position alignment is often provided on a circuit board during manufacture of the circuit board, during mounting of a component onto the circuit board, or during attaching of the circuit board to another member.

Japanese Unexamined Patent Application Publication No. 2003-304041 discloses a circuit board having increased translucency at a position at which an alignment mark is formed, for imaging the alignment mark by a transmission type.

As disclosed in Japanese Unexamined Patent Application Publication No. 2003-304041, when insulating base materials between which the alignment mark is interposed are all translucent, it is possible to detect the alignment mark by a transmission type. However, when the translucency of the insulating base materials between which the alignment mark is formed is low, it is necessary to detect the alignment mark by a reflection type.

However, when the alignment mark is formed by a conductor pattern, the alignment mark has the same thickness as other wiring patterns and the like, and light is reflected at the edges of a side surface and an upper surface of the alignment mark. Here, an example of reflection of light at the edges of the side surface and the upper surface of the alignment mark is shown in FIG. 7. In this example, the alignment mark is formed on a first main surface S1 of an electronic component. When an image sensor images the alignment mark of the electronic component, the image sensor receives reflected light (scattering light) from the edges of the side surfaces and the upper surfaces of the alignment mark. In the case of detecting the alignment mark by a reflection type as described, it may be difficult to accurately detect the boundary between the alignment mark and the insulating base material under the influence of the scattering light.

The above problem is a matter that applies to not only a circuit board but also to general electronic components.

SUMMARY OF THE INVENTION

Preferred embodiments of the present invention provide electronic components in each of which an insulating base material having low translucency is used, but accuracy of detection of the position of an alignment mark has been increased, electronic devices in which at least one of the electronic components is mounted, and methods for mounting the electronic components.

An electronic component according to a preferred embodiment of the present invention includes a multilayer body including a plurality of insulating base materials laminated on each other and including a first main surface and a second main surface which are perpendicular or substantially perpendicular to a lamination direction, and an alignment mark is defined by a conductor on one insulating base material among the plurality of insulating base materials. The multilayer body includes a first layer area located at a side of the first main surface with respect to the alignment mark and a second layer area located at a side of the second main surface with respect to the alignment mark, at least in a region in which the alignment mark is provided as seen in the lamination direction. An insulating base material in the first layer area has higher translucency than an insulating base material in the second layer area, and a cross-sectional shape of the alignment mark in the lamination direction is a trapezoidal shape including a first base at the side of the first main surface and a second base at the side of the second main surface, the first base being longer than the second base.

With this configuration, by using the large surface area side of the alignment mark (the surface at the longer base side of the trapezoid of the cross-sectional shape) as an image for alignment, reflected light at a side surface of the alignment mark is not imaged. Accordingly, the accuracy of detection of the position of the alignment mark is increased. In addition, the alignment mark is located within the multilayer body and is unlikely to be separated, and thus, has high resistance against external forces, such as collision and friction.

In an electronic component according to a preferred embodiment of the present invention, the insulating base material in the first layer area among the plurality of insulating base materials preferably includes an insulating base material made of the same material as the insulating base material in the second layer area. With this configuration, it is possible to easily provide the alignment mark in the multilayer body including the insulating base materials made of the same material. In particular, as compared to the case in which a protective film made of a material different from that of the insulating base material in the second layer area is provided on the surface on which the alignment mark is provided, inclusion of air bubbles, separation, and other defects due to a difference in physical property or the necessity to go through a process different from that for the second layer area is unlikely to occur, so that scattering light is unlikely to occur.

In an electronic component according to a preferred embodiment of the present invention, preferably, a conductor pattern which defines a circuit or a portion of a circuit is provided on at least one of the insulating base materials, and the alignment mark is made of the same material as the conductor pattern. Because of this configuration, it is not necessary to provide a pattern of the alignment mark made of a special material for the alignment mark, and manufacturing is facilitated, resulting in reduction in cost.

In an electronic component according to a preferred embodiment of the present invention, the conductor pattern and the alignment mark are, for example, patterned by etching of a copper foil attached to the at least one of the insulating base materials. According to this configuration, it is possible to easily form the alignment mark having a trapezoidal cross-sectional shape.

In an electronic component according to a preferred embodiment of the present invention, preferably, the insulating base material in the first layer area and the insulating base material in the second layer area are made of the same material, and the first layer area has a smaller thickness than the second layer area. With this structure, the translucency of the first layer region is easily made higher than that of the second layer area, while each insulating base material is made of the same material.

In an electronic component according to a preferred embodiment of the present invention, when the second layer area includes an adhesive layer joining the insulating base material in the second layer area and the insulating base material in the first layer area or an adhesive layer joining the insulating base materials in the second layer area, the adhesive layer preferably has a lower light transmittance than the insulating base material in the first layer area. With this structure, the translucency of the first layer region is easily made higher than that of the second layer area while each insulating base material is made of the same material.

An electronic device according to a preferred embodiment of the present invention includes a circuit board and an electronic component according to a preferred embodiment mounted on the circuit board. The electronic component includes a mounting terminal to mount the electronic component onto the circuit board.

With this configuration, it is possible to provide an electronic device including the electronic component mounted on the circuit board with high positional accuracy by using the alignment mark of the electronic component.

A method for mounting an electronic component onto a circuit board according to a preferred embodiment of the present invention is a method to mount an electronic component according to a preferred embodiment of the present invention onto a circuit board, the method including detecting the alignment mark of the electronic component by a reflection method in which the alignment mark is seen from the side of the first main surface of the electronic component; and mounting the electronic component to a specified position on the circuit board in accordance with a detected position of the electronic component.

With this configuration, the electronic component is mounted onto the circuit board with high positional accuracy using the alignment mark of the electronic component.

According to preferred embodiments of the present invention, electronic components in each of which an insulating base material having low translucency is used, but accuracy of detection of the position of an alignment mark is increased are obtained, and it is possible to provide electronic devices in each of which at least one of the electronic components is mounted on a circuit board with high positional accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1A:
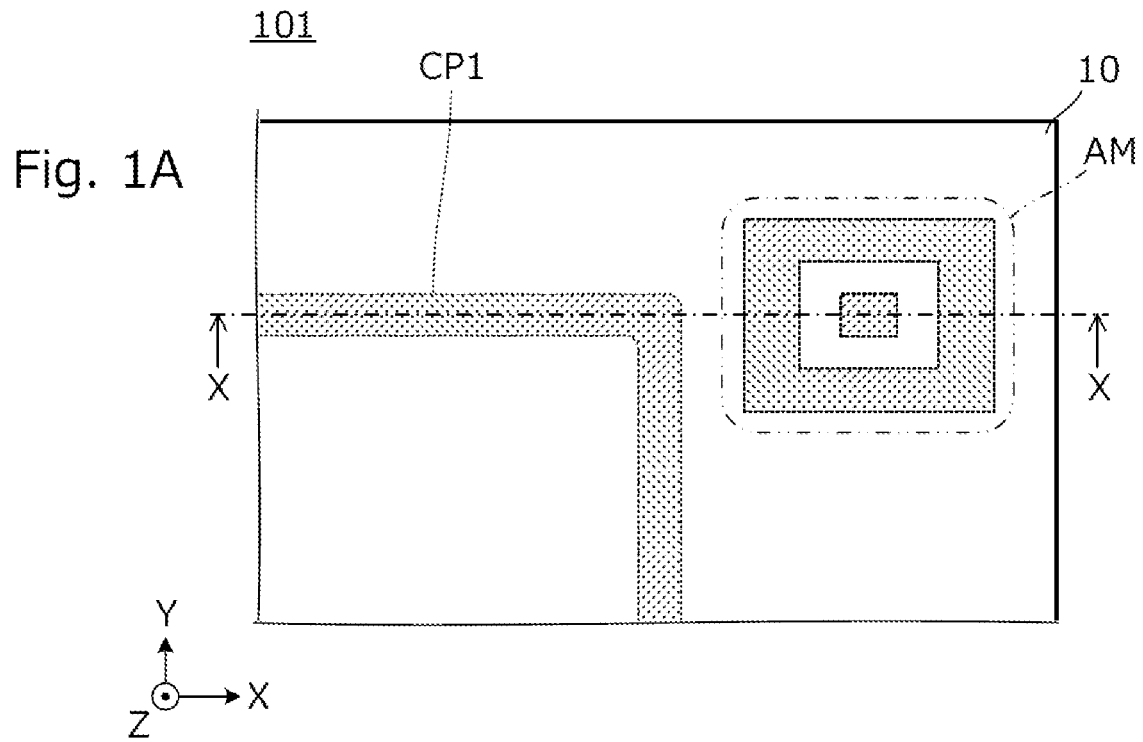
FIG. 1A is a plan view of an electronic component according to a first preferred embodiment of the present invention.
Figure 1B:
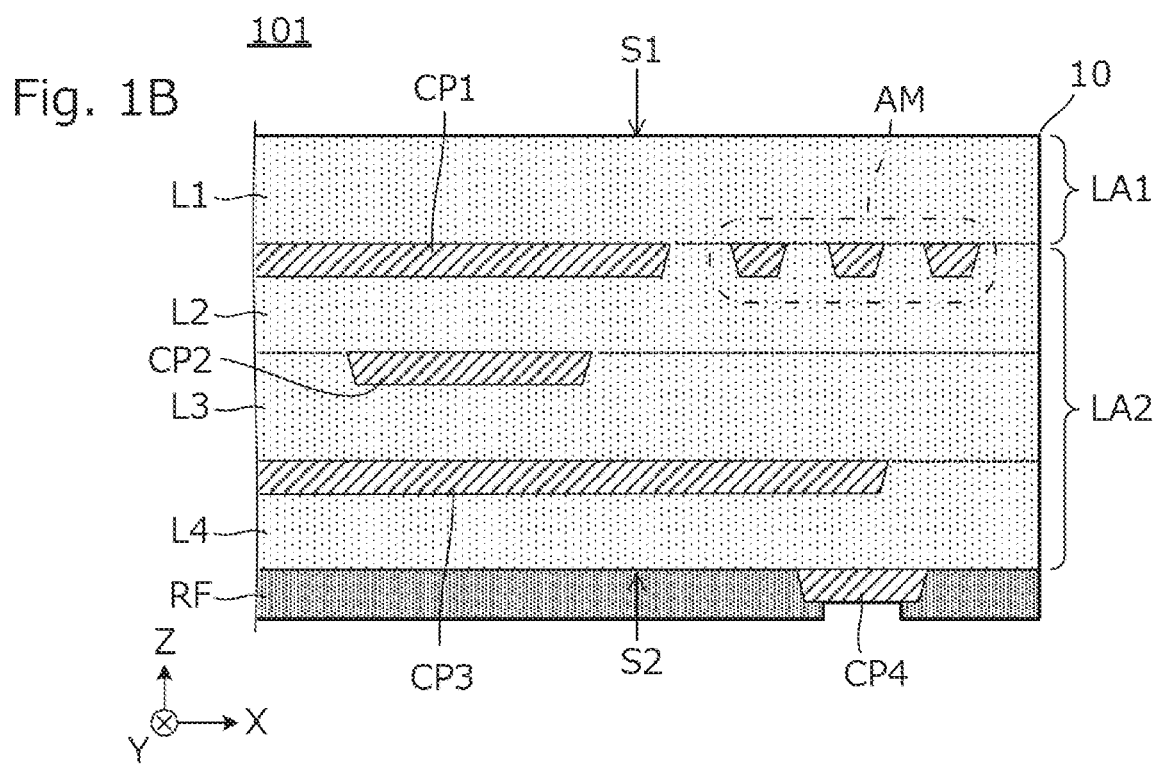
FIG. 1B is a cross-sectional view of the electronic component at an X-X portion in FIG. 1A.

FIG. 1A is a plan view of an electronic component 101 according to a first preferred embodiment of the present invention, and FIG. 1B is a cross-sectional view of the electronic component 101 at an X-X portion in FIG. 1A. In FIG. 1B, imaginary boundary surfaces between adjacent insulating base materials are represented by dotted lines.

The electronic component 101 of the present preferred embodiment includes a multilayer body 10 in which a plurality of insulating base materials L1 to L4 are laminated and which includes a first main surface S1 and a second main surface S2 perpendicular or substantially perpendicular to the lamination direction. An alignment mark AM defined by a conductor is provided on the one insulating base material L1 among the insulating base materials L1 to L4.

The multilayer body 10 includes a first layer area LA1 located at the side of the first main surface S1 with respect to the alignment mark AM and a second layer area LA2 located at the side of the second main surface S2 with respect to the alignment mark AM at least in the region in which the alignment mark AM is provided as seen in the lamination direction (Z-axis direction).

Conductor patterns CP1 to CP4 are provided in or on the multilayer body 10. In addition, in the present preferred embodiment, a resist film RF is preferably provided on the second main surface S2 of the multilayer body 10.

The conductor patterns CP1, CP2, and CP3 are, for example, coil patterns or wiring patterns. The conductor pattern CP4 is a mounting terminal.

The alignment mark AM preferably includes a rectangular or substantially rectangular frame-shaped pattern having a rectangular or substantially rectangular frame shape as a planar shape and a rectangular or substantially rectangular pattern disposed at the center thereof.

Although not shown in FIG. 1B, inter-layer connection conductors which connect conductor patterns provided on different layers are also provided within the multilayer body 10.

Hereinafter, the configuration of each portion of the electronic component 101 and a manufacturing method therefor will be sequentially described.

Figure 2A:
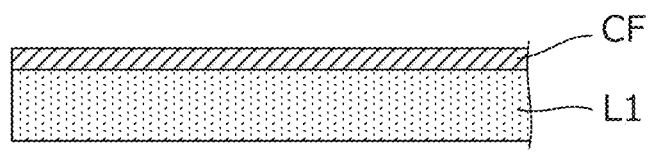
FIGS. 2A and 2B are cross-sectional views showing a conductor pattern provided on one insulating base material.
Figure 2B:
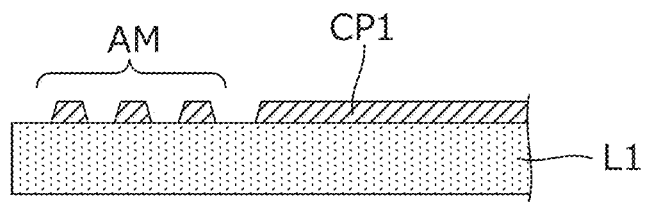

FIGS. 2A and 2B are cross-sectional views showing the conductor pattern provided on the one insulating base material L1. FIG. 2B is a cross-sectional view of a state in which the conductor pattern CP1 and the alignment mark AM have been provided on one surface of the insulating base material L1. FIG. 2A is a cross-sectional view of a state in which the conductor pattern and the alignment mark have not been provided.

The insulating base material L1 is preferably, for example, a thermoplastic resin sheet which is made of a liquid crystal polymer (LCP) and on which a copper foil CF is provided. The conductor pattern CP1 and the alignment mark AM are formed by patterning the copper foil CF by photolithography. For example, applying a photoresist film to the surface of the copper foil CF, pre-baking, exposing by using an exposure mask including a predetermined pattern, developing, post-baking, wet-etching, and removing the photoresist film are performed.

In the etching step, side etching is performed, so that the cross-sectional shapes of the conductor pattern CP1 and the alignment mark AM are trapezoidal shapes having a "longer base" which is a portion of the surface of the insulating base material L1, as shown in FIG. 2B. The same also applies to the materials and the method for forming the conductor patterns CP2 to CP4 on the other insulating base materials L2 to L4.

Figure 3A:
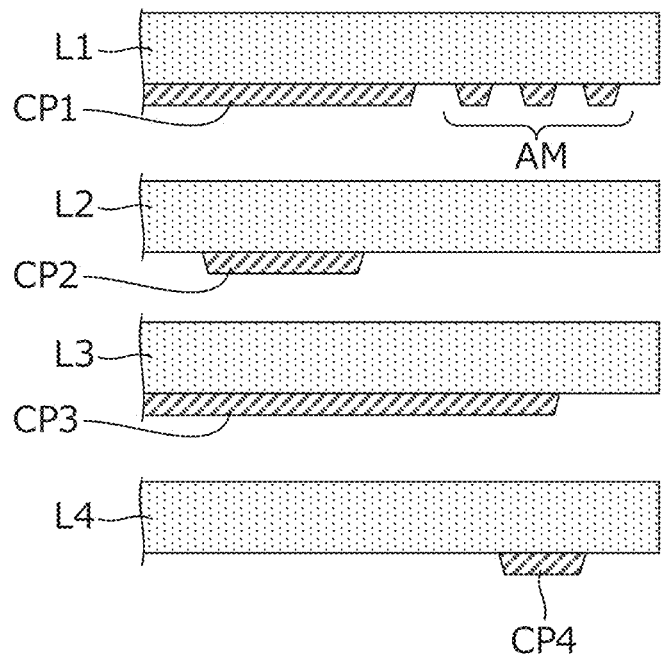
FIG. 3A is a cross-sectional view of a state before insulating base materials including conductor patterns provided thereon are stacked.

FIG. 3A is a cross-sectional view of a state before the insulating base materials L1 to L4 each including the conductor patterns CP1 to CP4 provided thereon by the above step, are stacked. As described above, the conductor pattern CP1 and the alignment mark AM are provided on the insulating base material L1. The conductor pattern CP2 is provided on the insulating base material L2, the conductor pattern CP3 is provided on the insulating base material L3, and the conductor pattern CP4 is provided on the insulating base material L4.

Figure 3B:
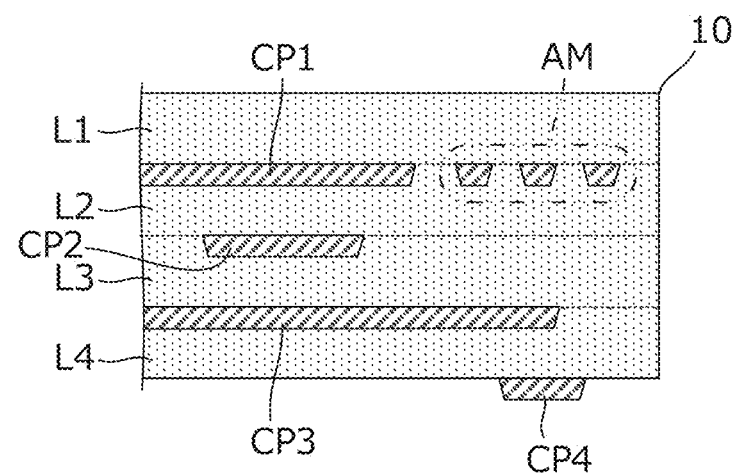
FIG. 3B is a cross-sectional view of a state in which the insulating base materials including the conductor patterns provided thereon have been stacked and hot-pressed.

FIG. 3B is a cross-sectional view of a state in which the insulating base materials L1 to L4 including the respective conductor patterns provided thereon have been stacked and hot-pressed. However, in FIG. 3B, the imaginary boundary surfaces between the adjacent insulating base materials are represented by dotted lines. In this manner, the multilayer body 10 is provided.

Figure 3C:
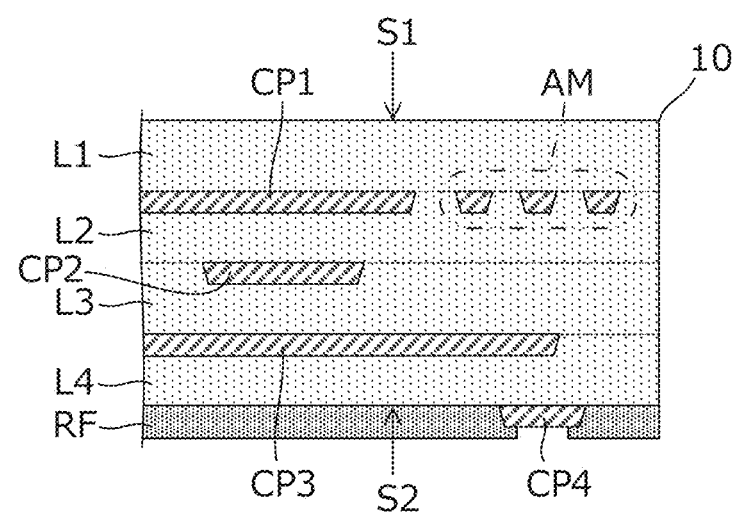
FIG. 3C is a cross-sectional view of a state in which a resist film has been provided on a multilayer body.

FIG. 3C is a cross-sectional view of a state in which the resist film RF has been provided on the multilayer body 10. As shown, the electronic component 101 shown in FIGS. 1A and 1B is formed by applying and forming the resist film RF, such as a solder resist, on the surface of the multilayer body 10 on which the mounting terminal CP4 is formed (the second main surface S2).

A plating film, such as Ni/Au or Ni/Sn, for example, may be provided on the surface of the mounting terminal CP4.

Although the single electronic component and a portion thereof are shown in FIGS. 3A to 3C, a collective board is actually produced and divided into individual pieces in a final step, such that multiple electronic components are produced at the same time.

Figure 4:
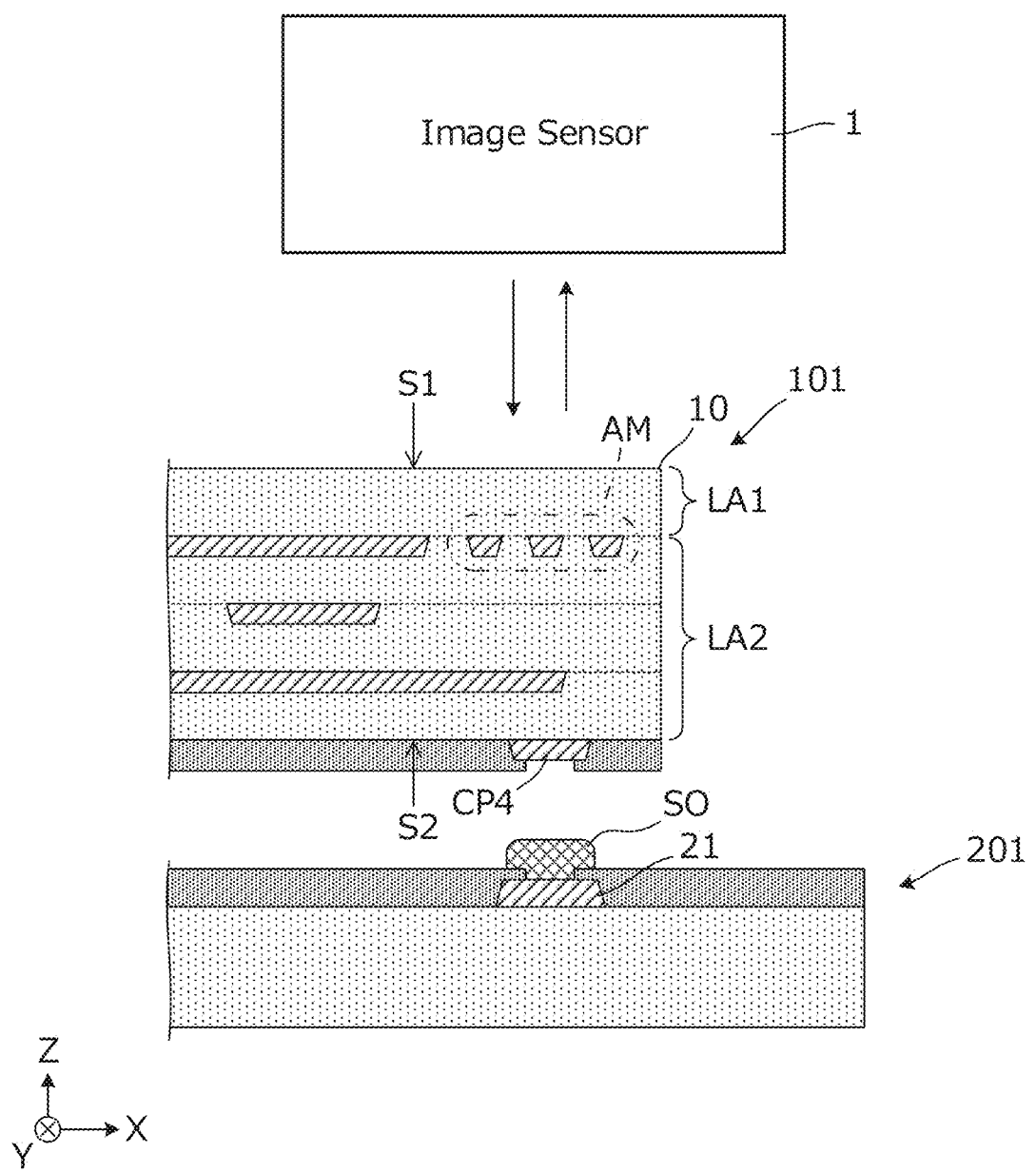
FIG. 4 is a diagram showing a method for mounting the electronic component onto a circuit board.

FIG. 4 is a diagram showing a method for mounting the electronic component 101 onto a circuit board 201. A circuit board-side terminal (pad) 21 is provided on the circuit board 201, and a solder paste SO is applied on the surface of the circuit board-side terminal 21. The circuit board 201 is fixed at a specified position, and an image sensor 1 detects the position of the alignment mark AM of the electronic component 101 in an X-Y plane direction.

The image sensor 1 detects the alignment mark AM of the electronic component 101 by a reflection method in which the alignment mark AM is seen from the side of the first main surface S1 of the electronic component 101, and the electronic component 101 is mounted at a specified position on the circuit board 201 in accordance with the detected position of the electronic component 101. That is, the electronic component 101 is mounted onto the circuit board 201 such that the mounting terminal CP4 of the electronic component 101 coincides with the position of the circuit board-side terminal 21.

Figure 5:
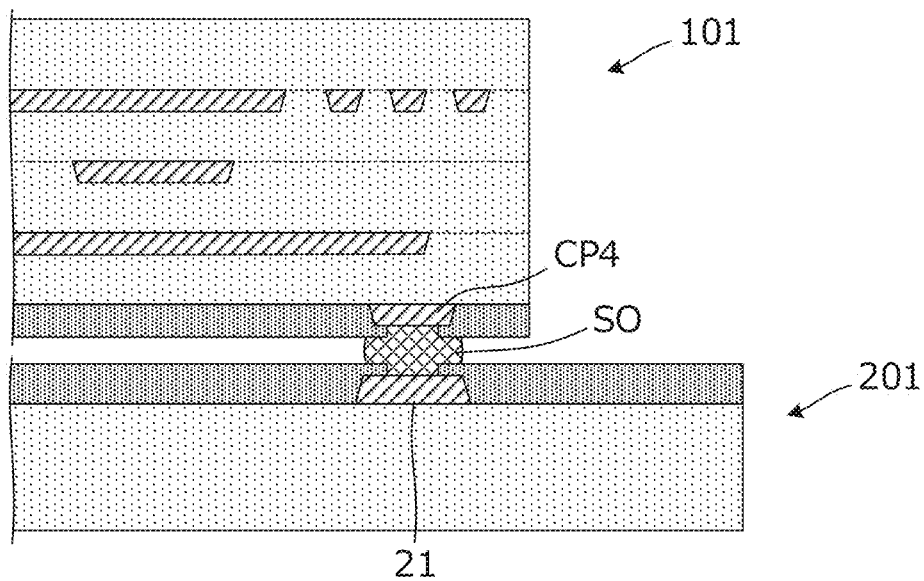
FIG. 5 is a cross-sectional view of a state in which the electronic component has been mounted on the circuit board.

FIG. 5 is a cross-sectional view of a state in which the electronic component 101 has been mounted on the circuit board 201. Through a reflow solder step after the mounting, the mounting terminal CP4 of the electronic component 101 is soldered to the circuit board-side terminal 21 of the circuit board 201. Accordingly, an electronic device 301 is formed.

The translucency (not "light transmittance" but "translucency") of the insulating base material in the first layer area LA1 of the multilayer body 10 is higher than the translucency of the insulating base material in the second layer area LA2, and thus, it is possible to image the alignment mark AM in the multilayer body 10 in high contrast. In addition, the cross-sectional shape of the alignment mark AM in the lamination direction (Z-axis direction) is a trapezoidal shape including a first base at the side of the first main surface S1 and a second base at the side of the second main surface S2, the first base being longer than the second base. Thus, scattering light at the edges of the side surfaces and the upper surfaces of the alignment mark AM is not imaged. Accordingly, it is possible to detect the position of the alignment mark AM with high accuracy.

Second Preferred Embodiment

In a second preferred embodiment of the present invention, an example of an electronic component including a multilayer body including an adhesive layer is shown.

Figure 6A:
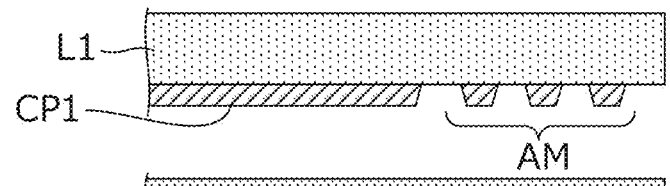
FIG. 6A is a cross-sectional view of a state before insulating base materials included in an electronic component according to a second preferred embodiment of the present invention are stacked.

FIG. 6A is a cross-sectional view of a state before insulating base materials included in an electronic component 102 according to the second preferred embodiment are stacked. On the insulating base material L1, the conductor pattern CP1 and the alignment mark AM are provided. The insulating base material L2 is an adhesive layer. The conductor pattern CP2 is provided on one surface of the insulating base material L3, and the conductor patterns CP3 and CP4 are provided on the other surface of the insulating base material L3.

Figure 6B:
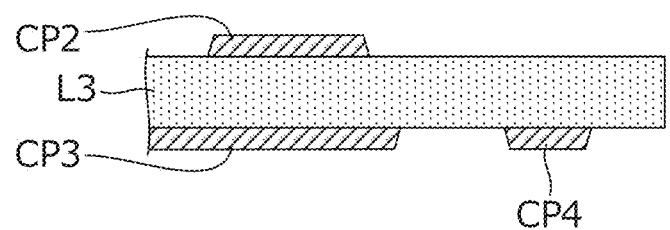
FIG. 6B is a cross-sectional view of a state in which insulating base materials have been stacked and hot-pressed.
Figure 6B:
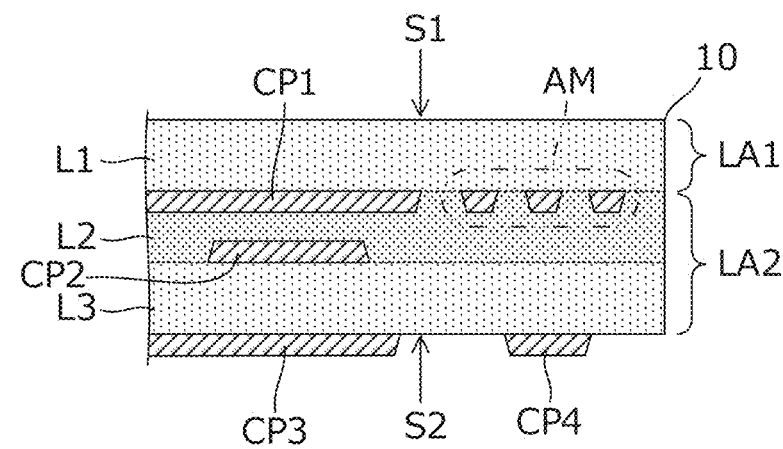

FIG. 6B is a cross-sectional view of a state in which the insulating base materials L1 to L3 have been stacked and hot-pressed. The insulating base materials L1 and L3 are bonded to each other via the insulating base material L2, which is the adhesive layer. In this manner, the multilayer body 10 is provided.

Figure 6C:
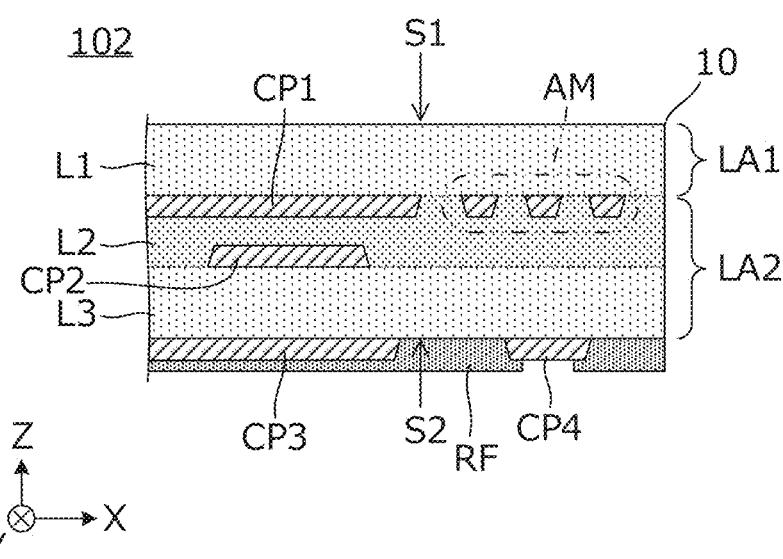
FIG. 6C is a cross-sectional view of a state in which a resist film has been provided on a multilayer body.
Figure 7:
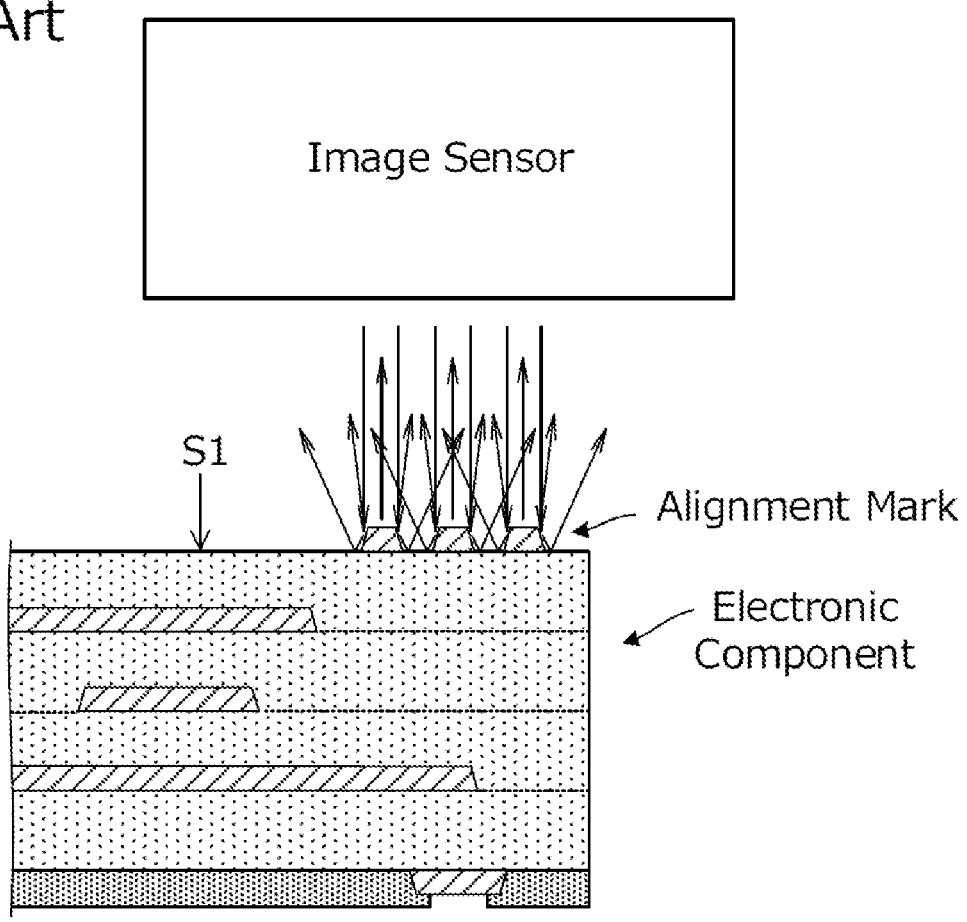
FIG. 7 is a diagram showing an example of reflection at the edges of side surfaces and upper surfaces of an alignment mark in the case in which the alignment mark is provided on the surface of a multilayer body.

FIG. 6C is a cross-sectional view of a state in which the resist film RF has been provided on the multilayer body 10. As shown, the electronic component 102 is formed by applying and forming the resist film RF, such as a solder resist, on the surface of the multilayer body 10 on which the mounting terminal CP4 is provided (the second main surface S2).

The multilayer body 10 includes the first layer area LA1 located at the side of the first main surface S1 with respect to the alignment mark AM, and the second layer area LA2 located at the side of the second main surface S2 with respect to the alignment mark AM. The insulating base material L2 defining the adhesive layer is made of a material having a low light transmittance. Thus, the translucency of the insulating base material in the first layer area LA1 of the multilayer body 10 is relatively higher than the translucency of the insulating base material in the second layer area LA2.

In the present preferred embodiment, similarly to the first preferred embodiment, it is possible to image the alignment mark AM in the multilayer body 10 in high contrast. In addition, the cross-sectional shape of the alignment mark AM in the lamination direction (Z-axis direction) is a trapezoidal shape including the first base at the side of the first main surface S1 and the second base at the side of the second main surface S2, the first base being longer than the second base. Thus, scattering light at the edges of the side surfaces and the upper surfaces of the alignment mark AM is not imaged. Accordingly, it is possible to detect the position of the alignment mark AM with high accuracy.

In FIGS. 6A to 6C, an example in which the adhesive layer joining the insulating base material L3 in the second layer area and the insulating base material L1 in the first layer area is provided in the second layer area is shown. As another example, an adhesive layer joining insulating base materials present in the second layer area may be included in the second layer area. That is, in this case as well, the translucency of the first layer area is relatively and more easily increased as compared to the translucency of the second layer area, by making the light transmittance of the adhesive layer lower than the light transmittance of the insulating base material in the first layer area.

In FIG. 1A, for example, the alignment mark AM, which is defined by the rectangular or substantially rectangular frame-shaped pattern having a rectangular or substantially rectangular frame shape as a planar shape and the rectangular or substantially rectangular pattern disposed at the center thereof, is shown. Patterns having various shapes such as a cross shape, a double cross shape, an L shape, a cross-hatching shape, a rectangular shape, and a circular shape, for example, may be used, and the same or substantially the same advantageous effects are achieved with any of these shapes.

In the preferred embodiments described above, the conductor patterns are formed by patterning the copper foils by wet etching. As long as the cross-sectional shape of the alignment mark is a trapezoidal shape including the first base at the side of the first main surface and the second base at the side of the second main surface, the first base being longer than the second base, the same advantageous effects are achieved by other pattern forming methods.

In each of the preferred embodiments described above, the electronic component including the mounting terminal provided on the second main surface of the multilayer body is illustrated. An electronic component according to another preferred embodiment of the present invention may include a mounting terminal provided on the first main surface of the multilayer body.

In FIGS. 1A, 1B, 6A, 6B, 6C, for example, a portion of the electronic component is shown. The first layer area LA1 and the second layer area LA2 only need to be distinguished from each other at least in the region at which the alignment mark AM is provided as seen in the lamination direction. Outside the region in which the alignment mark AM is provided as seen in the lamination direction, the first layer area LA1 and the second layer area LA2 do not necessarily need to be distinguished from each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a multilayer body including a plurality of insulating base materials laminated on each other and including a first main surface and a second main surface which are perpendicular or substantially perpendicular to a lamination direction; and
an alignment mark defined by a conductor and provided on one insulating base material among the plurality of insulating base materials; wherein
the multilayer body includes a first layer area located at a side of the first main surface with respect to the alignment mark and a second layer area located at a side of the second main surface with respect to the alignment mark, at least in a region in which the alignment mark is provided as viewed in the lamination direction;
an insulating base material in the first layer area has higher translucency than an insulating base material in the second layer area; and
a cross-sectional shape of the alignment mark in the lamination direction is a trapezoidal shape including a first base at the side of the first main surface and a second base at the side of the second main surface, the first base being longer than the second base, and the first base being substantially a portion of a surface of the one insulating base material on which the alignment mark is provided.

2. The electronic component according to claim 1, wherein the insulating base material in the first layer area among the plurality of insulating base materials includes an insulating base material made of a same material as the insulating base material in the second layer area.

3. The electronic component according to claim 1, wherein a conductor pattern which defines a circuit or a portion of a circuit is provided on at least one of the insulating base materials, and the alignment mark is made of a same material as the conductor pattern.

4. The electronic component according to claim 3, wherein the conductor pattern and the alignment mark are patterned by etching of a copper foil attached to the at least one of the insulating base materials.

5. The electronic component according to claim 1, wherein the insulating base material in the first layer area and the insulating base material in the second layer area are made of a same material, and the first layer area has a smaller thickness than the second layer area.

6. The electronic component according to claim 1, wherein the second layer area includes an adhesive layer joining the insulating base material in the second layer area and the insulating base material in the first layer area, or an adhesive layer joining the insulating base materials in the second layer area, and the adhesive layer has a lower light transmittance than the insulating base material in the first layer area.

7. An electronic device comprising:
a circuit board; and
the electronic component according to claim 1; wherein
the electronic component is mounted on the circuit board; and
the electronic component includes a mounting terminal to mount the electronic component onto the circuit board.

8. The electronic device according to claim 7, wherein the insulating base material in the first layer area among the plurality of insulating base materials includes an insulating base material made of a same material as the insulating base material in the second layer area.

9. The electronic device according to claim 7, wherein a conductor pattern which defines a circuit or a portion of a circuit is provided on at least one of the insulating base materials, and the alignment mark is made of a same material as the conductor pattern.

10. The electronic device according to claim 9, wherein the conductor pattern and the alignment mark are patterned by etching of a copper foil attached to the at least one of the insulating base materials.

11. The electronic device according to claim 7, wherein the insulating base material in the first layer area and the insulating base material in the second layer area are made of a same material, and the first layer area has a smaller thickness than the second layer area.

12. The electronic device according to claim 7, wherein the second layer area includes an adhesive layer joining the insulating base material in the second layer area and the insulating base material in the first layer area, or an adhesive layer joining the insulating base materials in the second layer area, and the adhesive layer has a lower light transmittance than the insulating base material in the first layer area.

13. A method for mounting the electronic component according to claim 1 onto a circuit board, the method comprising:
detecting the alignment mark of the electronic component by a reflection method in which the alignment mark is seen from the side of the first main surface; and
mounting the electronic component to a specified position on the circuit board in accordance with a detected position of the electronic component.

14. The method according to claim 13, wherein the insulating base material in the first layer area among the plurality of insulating base materials includes an insulating base material made of a same material as the insulating base material in the second layer area.

15. The method according to claim 13, wherein a conductor pattern which defines a circuit or a portion of a circuit is provided on at least one of the insulating base materials, and the alignment mark is made of a same material as the conductor pattern.

16. The method according to claim 15, wherein the conductor pattern and the alignment mark are patterned by etching of a copper foil attached to the at least one of the insulating base materials.

17. The method according to claim 13, wherein the insulating base material in the first layer area and the insulating base material in the second layer area are made of a same material, and the first layer area has a smaller thickness than the second layer area.

18. The method according to claim 13, wherein the second layer area includes an adhesive layer joining the insulating base material in the second layer area and the insulating base material in the first layer area, or an adhesive layer joining the insulating base materials in the second layer area, and the adhesive layer has a lower light transmittance than the insulating base material in the first layer area.

* * * * *